United States Patent

[11] 3,573,557

[72] Inventor Daniel W. Riggs
Huntsville, Ala.
[21] Appl. No. 9,300
[22] Filed Feb. 6, 1970
[45] Patented Apr. 6, 1971
[73] Assignee The United States of America as represented by the Secretary of the Army

[54] PRINTED CIRCUIT PROVIDED WITH COOLING MEANS
2 Claims, 2 Drawing Figs.

[52] U.S. Cl. .......... 317/100, 174/15, 317/101
[51] Int. Cl. .......... H02b 1/00, H05k 1/02
[50] Field of Search .......... 174/15, 16, 68.5; 317/100, 101 (C), 101 (CC), 234.1

[56] References Cited

UNITED STATES PATENTS

| | | | |
|---|---|---|---|
| 2,912,624 | 11/1959 | Wagner .......... | 317/100 |
| 3,389,305 | 6/1968 | Bond .......... | 317/100 |

FOREIGN PATENTS

| | | | |
|---|---|---|---|
| 1,105,068 | 3/1968 | Great Britain .......... | 174/68.5 |

*Primary Examiner*—Darrell L. Clay
*Attorneys*—Harry M. Saragovitz, Edward J. Kelly, Herbert Berl and Charles R. Carter

ABSTRACT: A printed circuit having a board disposed for the support of disposed components and provided with channels extending from a central point to outlet holes in the board at positions of the components. A plate is secured to the board to enclose the channels and provide conduit communication between the outlet holes and a coolant storage bottle. The size of the ports and the width of the channels control the amount of coolant flowing from the bottle to the components for augmenting their current carrying capacity.

Daniel W. Riggs,
INVENTOR

BY Harry M. Saragovitz
Edward J. Kelly
Herbert Berl
Charles R. Carter

PRINTED CIRCUIT PROVIDED WITH COOLING MEANS

BACKGROUND OF THE INVENTION

No printed circuit board having integral channels in the board for cooling the circuit components is known.

SUMMARY OF THE INVENTION

This invention provides a means for cooling printed circuit components thus cutting down their resistance and increasing their current carrying capacity to approximately 3 to 10 times their original capacity. The invention may be better understood from the following detailed description, taken in conjunction with the accompanying drawing.

DESCRIPTION OF THE PREFERRED EMBODIMENT

Figure 1:
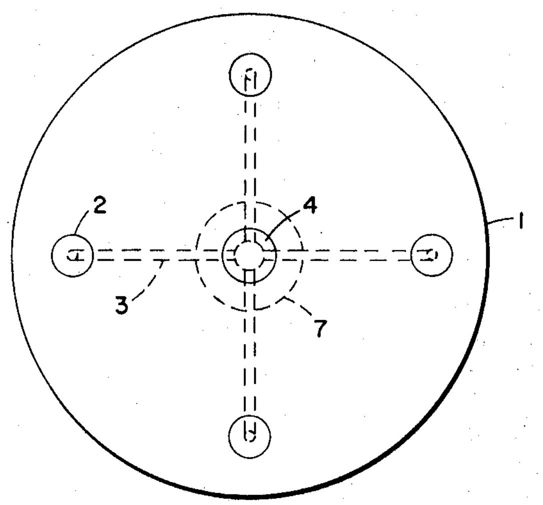
FIG. 1 is a plan view of the printed circuit board incorporating the cooling channels.
Figure 2:
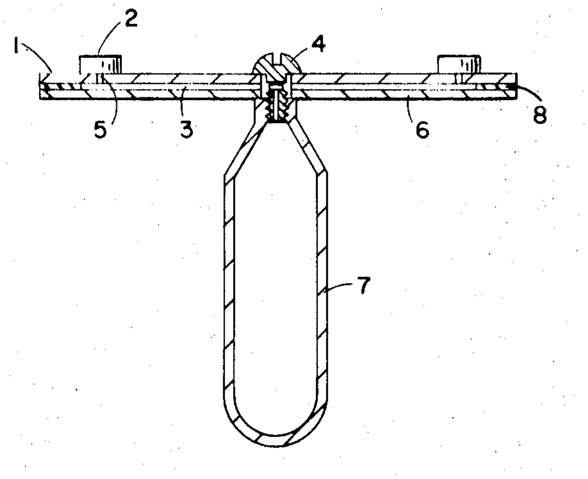
FIG. 2 is a sectional view of the printed circuit board including the cooling means.

Reference numeral 1 indicates a printed circuit board having components 2 mounted thereon. Channels 3 provide communication between a central point at valve 4 and outlet ports 5 directly beneath components 2. The fabrication of these channels on the printed circuit board is unique because it uses photography principles. A drawing of the components on a printed circuit board is made on a transparency or laid out on coordinator paper. The drawing is then photographically reduced to actual size desired. The board is either made of a material that can be eroded or clad with a material 8 that can be eroded. This material is coated with a photosensitive chemical and placed under a light with the photo positive or negative over it, thus the desired configuration is photo etched on the board. The board is then treated with an acid for a predetermined period of time to erode the channels. A plate 6 is secured to the board to enclose the channels to provide conduits for a coolant, such as FREON, from a storage bottle 7 to the outlet ports. The size of the port openings and the width of the etched channels control the amount of coolant flow from the bottle to the components for augmenting their current carrying capacity. The bottle is rotatably secured to the channeled connector for replacement purposes.

I claim:

1. In combination a printed circuit board with components secured to a surface thereon; said board having channels in the opposite surface from a point to said components and provided with outlet ports adjacent said components; a plate secured to said board to provide conduits through said channels; a coolant supply device secured to said board in communication with said channels for supplying a coolant to components to augment the current carrying capacity thereof; and a valve in said device to control the flow of coolant to the channels.

2. A printed circuit as in claim 1 in which said coolant supply device comprises a bottle containing the coolant.